United States Patent
Kim

(10) Patent No.: US 10,498,364 B2
(45) Date of Patent: Dec. 3, 2019

(54) ERROR CORRECTION CIRCUITS AND MEMORY CONTROLLERS INCLUDING THE SAME

(71) Applicant: SK hynix Inc., Gyeonggi-do (KR)

(72) Inventor: Soo Jin Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 105 days.

(21) Appl. No.: 15/627,758

(22) Filed: Jun. 20, 2017

(65) Prior Publication Data

US 2018/0152203 A1  May 31, 2018

(30) Foreign Application Priority Data

Nov. 25, 2016  (KR) .................. 10-2016-0158370

(51) Int. Cl.
| | |
|---|---|
| *H03M 13/15* | (2006.01) |
| *H03M 13/07* | (2006.01) |
| *G11C 16/34* | (2006.01) |
| *G11C 29/04* | (2006.01) |
| *G11C 29/42* | (2006.01) |

(Continued)

(52) U.S. Cl.
CPC ....... *H03M 13/151* (2013.01); *G11C 16/3404* (2013.01); *G11C 29/04* (2013.01); *G11C 29/42* (2013.01); *G11C 29/4401* (2013.01); *G11C 29/52* (2013.01); *H03M 13/07* (2013.01); *H03M 13/152* (2013.01); *H03M 13/153* (2013.01); *H03M 13/1595* (2013.01); *H03M 13/6561* (2013.01); *G11C 2029/0411* (2013.01)

(58) Field of Classification Search
CPC .. H03M 13/151; H03M 13/07; H03M 13/152; H03M 13/153; H03M 13/1595; H03M 13/6561; G11C 16/3404; G11C 29/04; G11C 29/42; G11C 29/4401; G11C 29/52; G11C 2029/0411
See application file for complete search history.

(56) References Cited

U.S. PATENT DOCUMENTS

| | | | | | |
|---|---|---|---|---|---|
| 5,438,577 | A | * | 8/1995 | Nakase | .................. H03M 13/00 714/771 |
| 5,887,006 | A | * | 3/1999 | Sharma | ............... H03M 13/151 708/400 |

(Continued)

FOREIGN PATENT DOCUMENTS

KR  101619049  5/2016

OTHER PUBLICATIONS

IEEE 100, The Authoritative Dictionary of IEEE Standards Terms, Seventh Edition, IEEE Standards (Year: 2000).*

*Primary Examiner* — April Y Blair
*Assistant Examiner* — Dipakkumar B Gandhi
(74) *Attorney, Agent, or Firm* — IP & T Group LLP

(57) ABSTRACT

An error correction circuit includes a syndrome calculator suitable for generating syndromes from an "n"-bit codeword for a single unit of time, an error location polynomial calculator suitable for generating error location polynomial coefficients based on the syndromes provided for the single unit of time, an error location calculator suitable for calculating error locations based on the error location polynomial coefficients for the single unit of time, and an error corrector suitable for correcting errors of the codeword based on the error locations for the single unit of time. The error correction circuit operates in a pipelining manner.

23 Claims, 12 Drawing Sheets

(51) Int. Cl.
  *G11C 29/44* (2006.01)
  *G11C 29/52* (2006.01)
  *H03M 13/00* (2006.01)
  *H03M 13/53* (2006.01)

(56) References Cited

U.S. PATENT DOCUMENTS

| | | | | |
|---|---|---|---|---|
| 2001/0014960 A1* | 8/2001 | Ohyama | ............ | H03M 13/151 |
| | | | | 714/755 |
| 2004/0088635 A1* | 5/2004 | Kravtchenko | ..... | G11B 20/1833 |
| | | | | 714/758 |
| 2004/0255226 A1 | 12/2004 | Kondou | | |

\* cited by examiner

FIG.5

\* Initialization:

$\delta_5(0) = 0, \ \delta_6(0) = 1 \quad \delta_7(0) = 0, \ \delta_8(0) = 0,$ $\theta_5(0) = 0 \quad \theta_6(0) = 1 \quad \theta_7(0) = 0$ $k(0) = 0$ $\gamma(0) = 1$ \* Input: $\{S_0, S_1, S_2, S_3, S_4\}$ $\delta_i(0) = \theta_i(0) = S_i, (i = 0, 1, 2, 3, 4)$

SiBM1. $\delta_0(1) = \gamma(0) \cdot \delta_2(0) + \delta_8(0)\theta_1(0) = 1 \cdot S_2 + S_0 \cdot S_1 = S_2 + S_0 \cdot S_1$ $\delta_1(1) = \gamma(0) \cdot \delta_3(0) + \delta_8(0)\theta_2(0) = 1 \cdot S_3 + S_0 \cdot S_2 = S_3 + S_0 \cdot S_2$ $\delta_2(1) = \gamma(0) \cdot \delta_4(0) + \delta_8(0)\theta_3(0) = 1 \cdot S_4 + S_0 \cdot S_3 = S_4 + S_0 \cdot S_3$ $\delta_3(1) = \gamma(0) \cdot \delta_5(0) + \delta_8(0)\theta_4(0) = 1 \cdot 0 + S_0 \cdot S_4 = S_0 \cdot S_4$ $\delta_4(1) = \gamma(0) \cdot \delta_6(0) + \delta_8(0)\theta_5(0) = 1 \cdot 1 + S_0 \cdot 0 = 1$ $\delta_5(1) = \gamma(0) \cdot \delta_7(0) + \delta_8(0)\theta_6(0) = 1 \cdot 0 + S_0 \cdot 1 = S_0$ $\delta_6(1) = \gamma(0) \cdot \delta_8(0) + \delta_8(0)\theta_7(0) = 1 \cdot 0 + S_0 \cdot 0 = 0$

SiBM2. *if* $\delta_8(0) \neq 0$ *and* $k(0) \geq 0 \Rightarrow$ true

$\theta_0(1) = \delta_1(0) = S_1, \ \theta_1(1) = \delta_2(0) = S_2, \ \theta_2(1) = \delta_3(0) = S_3,$ $\theta_5(1) = \delta_6(0) = 1, \ \theta_6(1) = \delta_7(0) = 0$ $\gamma(1) = \delta_8(0) = S_0$ $k(1) = -k(0) = 0$

*if* $\delta_8(0) \neq 0$ *and* $k(0) \geq 0 \Rightarrow$ false

$\theta_0(1) = \theta_0(0) = S_0, \ \theta_1(1) = \theta_1(0) = S_1, \ \theta_2(1) = \theta_2(0) = S_2,$ $\theta_5(1) = \theta_5(0) = 0, \ \theta_6(1) = \theta_6(0) = 1$ $\gamma(1) = \gamma(0) = 1$ $k(1) = k(0) + 1 = 1$ $\theta_3(1) = 0, \ \theta_4(1) = 0$

SiBM3. *if* $\delta_0(0) \neq 0$ *and* $k(0) \geq 0 \Rightarrow$ true

$\delta_0(2) = \gamma(1) \cdot \delta_2(1) + \delta_0(1)\theta_1(1) = S_0 \cdot (S_4 + S_0 \cdot S_3) + (S_2 + S_0 \cdot S_1) \cdot S_2$ $\delta_1(2) = \gamma(1) \cdot \delta_3(1) + \delta_0(1)\theta_2(1) = S_0 \cdot (S_0 \cdot S_4) + (S_2 + S_0 \cdot S_1) \cdot S_3$ $\delta_2(2) = \gamma(1) \cdot \delta_4(1) + \delta_0(1)\theta_3(1) = S_0 \cdot 1 + (S_2 + S_0 \cdot S_1) \cdot 0 = S_0$ $\delta_3(2) = \gamma(1) \cdot \delta_5(1) + \delta_0(1)\theta_4(1) = S_0 \cdot S_0 + (S_2 + S_0 \cdot S_1) \cdot 0 = S_0 \cdot S_0$ $\delta_4(2) = \gamma(1) \cdot \delta_6(1) + \delta_0(1)\theta_5(1) = S_0 \cdot 0 + (S_2 + S_0 \cdot S_1) \cdot 1 = S_2 + S_0 \cdot S_1$ $\delta_5(2) = \gamma(1) \cdot \delta_7(1) + \delta_0(1)\theta_6(1) = S_0 \cdot 0 + (S_2 + S_0 \cdot S_1) \cdot 0 = 0$ $\delta_6(2) = \gamma(1) \cdot \delta_8(1) + \delta_0(1)\theta_7(1) = S_0 \cdot 0 + (S_2 + S_0 \cdot S_1) \cdot 0 = 0$

*if* $\delta_0(0) \neq 0$ *and* $k(0) \geq 0 \Rightarrow$ false

$\delta_0(2) = \gamma(1) \cdot \delta_2(1) + \delta_0(1)\theta_1(1) = (S_4 + S_0 \cdot S_3) + (S_2 + S_0 \cdot S_1) \cdot S_2$ $\delta_1(2) = \gamma(1) \cdot \delta_3(1) + \delta_0(1)\theta_2(1) = (S_0 \cdot S_4) + (S_2 + S_0 \cdot S_1) \cdot S_3$ $\delta_2(2) = \gamma(1) \cdot \delta_4(1) + \delta_0(1)\theta_3(1) = 1 \cdot 1 + (S_2 + S_0 \cdot S_1) \cdot 0 = 1$ $\delta_3(2) = \gamma(1) \cdot \delta_5(1) + \delta_0(1)\theta_4(1) = 1 \cdot S_0 + (S_2 + S_0 \cdot S_1) \cdot 0 = S_0$ $\delta_4(2) = \gamma(1) \cdot \delta_6(1) + \delta_0(1)\theta_5(1) = 1 \cdot 0 + (S_2 + S_0 \cdot S_1) \cdot 0 = 0$ $\delta_5(2) = \gamma(1) \cdot \delta_7(1) + \delta_0(1)\theta_6(1) = 1 \cdot 0 + (S_2 + S_0 \cdot S_1) \cdot 1 = S_2 + S_0 \cdot S_1$ $\delta_6(2) = \gamma(1) \cdot \delta_8(1) + \delta_0(1)\theta_7(1) = 1 \cdot 0 + (S_2 + S_0 \cdot S_1) \cdot 0 = 0$

FIG.8

SiBM4. *if* $\delta_0(1) \neq 0$ *and* $k(1) \geq 0 \Rightarrow$ true

$$\theta_0(2) = \delta_1(1) = S_3 + S_0 \cdot S_2,$$

$$\theta_3(2) = \delta_4(1) = 1, \qquad \theta_4(2) = \delta_5(1) = S_0$$

$$\theta_5(2) = \delta_6(1) = 0, \qquad \theta_6(2) = \delta_7(1) = 0$$

$$\gamma(2) = \delta_0(1) = S_2 + S_0 \cdot S_1$$

$$k(2) = -k(1) = 0$$

*if* $\delta_0(1) \neq 0$ *and* $k(1) \geq 0 \Rightarrow$ false

*if* $\delta_0(0) \neq 0$ *and* $k(0) \geq 0 \Rightarrow$ true

$$\theta_0(2) = \theta_0(1) = S_1$$

$$\theta_3(2) = \theta_3(1) = 0, \qquad \theta_4(2) = \theta_4(1) = 0$$

$$\theta_5(2) = \theta_5(1) = 1, \qquad \theta_6(2) = \theta_6(1) = 0,$$

$$\gamma(2) = \gamma(1) = S_0$$

$$k(2) = k(1) + 1 = 1$$

*if* $\delta_0(0) \neq 0$ *and* $k(0) \geq 0 \Rightarrow$ false

$$\theta_0(2) = \theta_0(1) = S_0$$

$$\theta_3(2) = \theta_3(1) = 0, \qquad \theta_4(2) = \theta_4(1) = 0$$

$$\theta_5(2) = \theta_5(1) = 0, \qquad \theta_6(2) = \theta_6(1) = 1,$$

$$\gamma(2) = \gamma(1) = 1$$

$$k(2) = k(1) + 1 = 1$$

$$\theta_1(2) = 0, \, \theta_2(2) = 0$$

SiBMS. *if $\delta_0(0) \neq 0$ and $k(0) \geq 0$ ⇒ true & if $\delta_0(1) \neq 0$ and $k(1) \geq 0$ ⇒ true* (FIRST CONDITION : TT)

$\delta_0(3) = \gamma(2) \cdot \delta_0(2) + \delta_0(2)\theta_1(2) = (S_2 + S_0 \cdot S_1) \cdot S_0$ $\delta_1(3) = \gamma(2) \cdot \delta_1(2) + \delta_0(2)\theta_2(2) = (S_2 + S_0 \cdot S_1) \cdot (S_0 \cdot S_0)$ $\delta_2(3) = \gamma(2) \cdot \delta_2(2) + \delta_0(2)\theta_3(2)$
$= (S_2 + S_0 \cdot S_1) \cdot (S_2 + S_0 \cdot S_1) + (S_0 \cdot (S_4 + S_0 \cdot S_3) + (S_2 + S_0 \cdot S_1) \cdot S_2)$ $\delta_3(3) = \gamma(2) \cdot \delta_3(2) + \delta_0(2)\theta_4(2) = (S_0 \cdot (S_4 + S_0 \cdot S_3) + (S_2 + S_0 \cdot S_1) \cdot S_2) \cdot S_0$

*if $\delta_0(0) \neq 0$ and $k(0) \geq 0$ ⇒ true & if $\delta_0(1) \neq 0$ and $k(1) \geq 0$ ⇒ false* (SECOND CONDITION : TF)

$\delta_0(3) = \gamma(2) \cdot \delta_0(2) + \delta_0(2)\theta_1(2) = S_0 \cdot S_0$ $\delta_1(3) = \gamma(2) \cdot \delta_1(2) + \delta_0(2)\theta_2(2) = S_0 \cdot S_0 \cdot S_0$ $\delta_2(3) = \gamma(2) \cdot \delta_2(2) + \delta_0(2)\theta_3(2) = S_0 \cdot (S_2 + S_0 \cdot S_1)$ $\delta_3(3) = \gamma(2) \cdot \delta_3(2) + \delta_0(2)\theta_4(2) = 0$

*if $\delta_0(0) \neq 0$ and $k(0) \geq 0$ ⇒ false & if $\delta_0(1) \neq 0$ and $k(1) \geq 0$ ⇒ true* (THIRD CONDITION : FT)

$\delta_0(3) = \gamma(2) \cdot \delta_0(2) + \delta_0(2)\theta_1(2) = (S_2 + S_0 \cdot S_1) \cdot 1$ $\delta_1(3) = \gamma(2) \cdot \delta_1(2) + \delta_0(2)\theta_2(2) = (S_2 + S_0 \cdot S_1) \cdot S_0$ $\delta_2(3) = \gamma(2) \cdot \delta_2(2) + \delta_0(2)\theta_3(2) = (S_4 + S_0 \cdot S_3) + (S_2 + S_0 \cdot S_1) \cdot S_1$ $\delta_3(3) = \gamma(2) \cdot \delta_3(2) + \delta_0(2)\theta_4(2) =$
$(S_2 + S_0 \cdot S_1) \cdot (S_2 + S_0 \cdot S_1) + ((S_4 + S_0 \cdot S_3) + (S_2 + S_0 \cdot S_1) \cdot S_1) \cdot S_0$

*if $\delta_0(0) \neq 0$ and $k(0) \geq 0$ ⇒ false & if $\delta_0(1) \neq 0$ and $k(1) \geq 0$ ⇒ false* (FOURTH CONDITION : FF)

$\delta_0(3) = \gamma(2) \cdot \delta_0(2) + \delta_0(2)\theta_1(2) = 1$ $\delta_1(3) = \gamma(2) \cdot \delta_1(2) + \delta_0(2)\theta_2(2) = S_0$ $\delta_2(3) = \gamma(2) \cdot \delta_2(2) + \delta_0(2)\theta_3(2) = 0$ $\delta_3(3) = \gamma(2) \cdot \delta_3(2) + \delta_0(2)\theta_4(2) = S_2 + S_0 \cdot S_1$

ERROR CORRECTION CIRCUITS AND MEMORY CONTROLLERS INCLUDING THE SAME

CROSS-REFERENCE TO RELATED APPLICATION

The present application claims priority under 35 U.S.C 119(a) to Korean Application No. 10-2016-0158370, filed on Nov. 25, 2016, which is herein incorporated by references in its entirety.

BACKGROUND

1. Technical Field

Various embodiments of the present disclosure relate to error correction circuits and memory controllers including the same.

2. Related Art

Nonvolatile memory devices retain their stored data even when their power supplies are interrupted, and data storage units including the nonvolatile memory devices may be widely used in portable systems such as smart phones, digital cameras or computers. The nonvolatile memory devices, particularly, NAND-type flash memory devices have been developed using multi-level cell (MLC) techniques and advanced process techniques to increase the integration density of the NAND-type flash memory devices. The MLC techniques have been proposed to increase the number of bits which are capable of storing data in a single cell, and the advanced process techniques may be proposed to reduce a minimum feature size of patterns constituting memory cells of semiconductor devices. Recently, three-dimensional and vertical cell structures have been developed to overcome the limitation of planar-type memory cell array structures in which memory cells are two dimensionally arrayed and to more efficiently Increase the Integration density of the NAND-type flash memory devices.

The process techniques for forming fine patterns and the MLC techniques for increasing the number of bits in a limited area may lead to degradation of the reliability of the NAND-type flash memory devices, since cell-to-cell interference occurs if a pattern size is reduced. Furthermore, data error easily occurs if multi-bits are realized in a single cell using the MLC techniques. Accordingly, an error correction code (ECC) scheme has been used to guarantee the reliability of the semiconductor devices which are fabricated using the advanced process techniques and the MLC techniques.

In case of the nonvolatile memory devices such as phase change random access memory (PCRAM) devices, magnetoresistive RAM (MRAM) devices, nano floating gate memory (NFGM) devices, resistive RAM (RRAM) devices or polymer RAM devices, a read margin for recognizing a difference between a data "0" and a data "1" may be relatively narrow due to the nature of cells thereof. Thus, the nonvolatile memory devices including the PCRAM devices, the MRAM device, the NFGM devices, the RRAM devices and the polymer RAM devices may exhibit a relatively high error rate as compared with the NAND-type flash memory devices even though a single level cell (SLC) structure is employed therein. Accordingly, it may be advantageous to employ the ECC scheme in nonvolatile memory devices including the PCRAM devices, the MRAM device, the NFGM devices, the RRAM devices and the polymer RAM devices.

If the semiconductor devices employing the ECC scheme exhibit a relatively low error rate, a Hamming code may be used to detect and correct the data errors. In contrast, if the semiconductor devices employing the ECC scheme exhibit a relatively high error rate, a Bose-Chaudhuri-Hocquenghem (BCH) code or a Reed-Solomon (RS) code may be used to detect and correct the data errors. A binary BCH code may be designed to have a high code rate and may be realized using a relatively simple circuit, as compared with the RS code.

A decoding algorithm of the BCH code may include a syndrome calculation operation, an error location polynomial calculation operation, an error location calculation operation and an error correction operation. The error location polynomial calculation operation may be performed according to a Berlekamp-Massey (BM) algorithm. Since the error location polynomial calculation operation according to the BM algorithm is executed by a recursive operation, many clock pulses are required to execute the error location polynomial calculation operation. Accordingly, if the BCH code is used in an error correction circuit, a total decoding time may increase which degrades the performance of the error correction circuit.

SUMMARY

Various embodiments are directed to error correction circuits and memory controllers including the same.

According to an embodiment, an error correction circuit includes a syndrome calculator suitable for generating syndromes from an "n"-bit codeword for a single unit of time, an error location polynomial calculator suitable for generating error location polynomial coefficients based on the syndromes provided for the single unit of time, an error location calculator suitable for calculating error locations based on the error location polynomial coefficients for the single unit of time, and an error corrector suitable for correcting errors of the codeword based on the error locations for the single unit of time. The error correction circuit operates in a pipelining manner.

According to another embodiment, an error correction circuit includes a syndrome calculator suitable for generating "2t"-number of parallel syndromes from an "n"-bit parallel codeword, an error location polynomial calculator suitable for generating error location polynomial coefficients based on the parallel syndromes, an error location calculator suitable for generating error locations based on the parallel error location polynomial coefficients, and an error corrector suitable for generating decoded data of the codeword by correcting errors of the codeword based on the error locations.

BRIEF DESCRIPTION OF THE DRAWINGS

Various embodiments of the present disclosure will become more apparent in view of the attached drawings and accompanying detailed description, in which:

FIGS. 5 to 9 illustrate pre-calculation steps for obtaining coefficients corresponding to output data of the error location polynomial calculator shown in FIG. 4;

DETAILED DESCRIPTION OF THE EMBODIMENTS

In the following description of the embodiments, it will be understood that the terms "first" and "second" are intended to identify an element, but not used to define only the element itself or to mean a particular sequence. In addition, when an element is referred to as being located "on", "over", "above", "under" or "beneath" another element, it is intended to mean relative position relationship, but not used to limit certain cases in which the element directly contacts the other element, or at least one intervening element is present therebetween. Accordingly, the terms such as "on", "over", "above", "under", "beneath", "below" and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may form a connection relationship or coupling relationship by replacing the other element therebetween.

Figure 1:
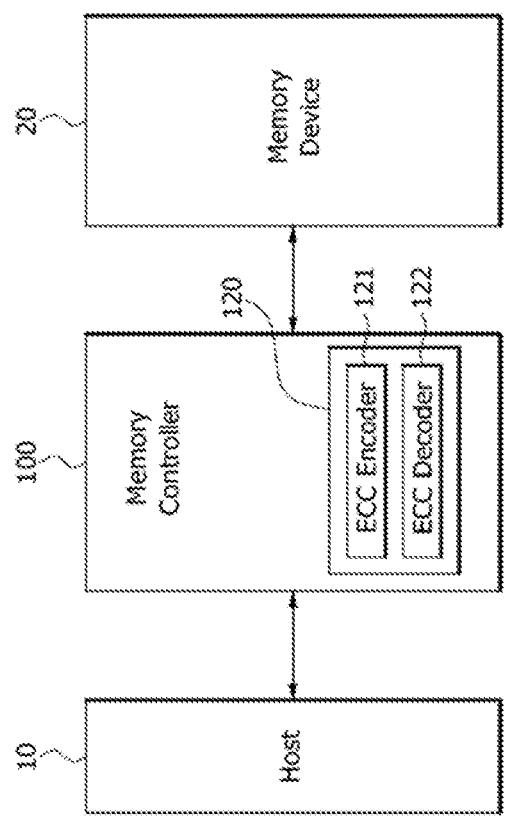
FIG. 1 is a block diagram illustrating an electronic system including a memory controller according to an embodiment of the present disclosure.

FIG. 1 is a block diagram illustrating an electronic system including a memory controller 100 according to an embodiment of the present disclosure.

Referring to FIG. 1, the electronic system may include a host 10, a memory device 20, and the memory controller 100 coupled between the host 10 and the memory device 20. The memory controller 100 may receive a command from the host 10 to control various operations for example, an erasure operation, a write operation or a program operation, and a read operation of the memory device 20. The memory controller 100 may include an error correction circuit 120 suitable for correcting erroneous bits of data. The error correction circuit 120 may include an ECC encoder 121 and an ECC decoder 122. The ECC encoder 121 may perform an ECC encoding operation to data, which are to be written into the memory device 20, to generate a codeword including bits of a parity. The ECC decoder 122 may perform an ECC decoding operation of the codeword outputted from the memory device 20.

Figure 2:
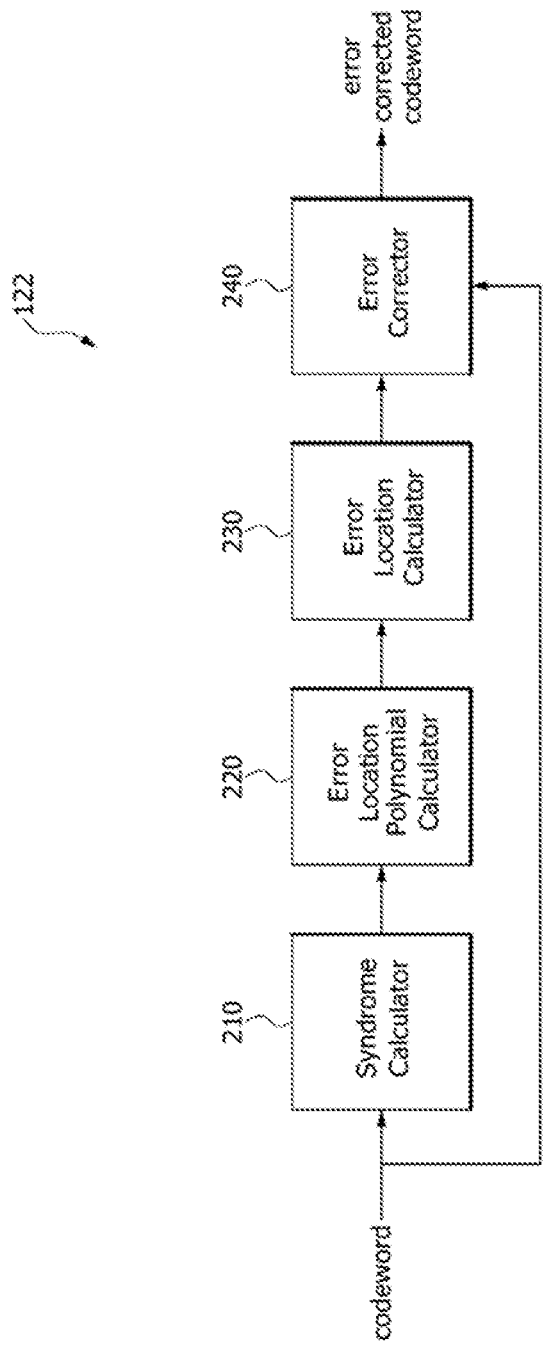
FIG. 2 is a block diagram illustrating an error correction code (ECC) decoder of an error correction circuit according to an embodiment of the present disclosure.

FIG. 2 is a block diagram illustrating a configuration of the ECC decoder 122 included in the error correction circuit 120 of FIG. 1.

Referring to FIG. 2, the ECC decoder 122 may include a syndrome calculator 210, an error location polynomial calculator 220, an error location calculator 230 and an error corrector 240.

The syndrome calculator 210 may calculate and output syndromes necessary for calculation of an error location polynomial based on a codeword outputted from the memory device 20.

The error location polynomial calculator 220 may receive the syndromes from the syndrome calculator 210 to calculate and output coefficients of the error location polynomial to which the BM algorithm is applied.

The error location calculator 230 may calculate and output an error location signal using the coefficients of the error location polynomial, which are outputted from the error location polynomial calculator 220.

The error corrector 240 may correct an error of data by inverting a logic level of an erroneous bit corresponding to the error location signal outputted from the error location calculator 230.

In the present embodiment, each of the syndrome calculator 210, the error location polynomial calculator 220, the error location calculator 230 and the error corrector 240 may complete its operation for one clock cycle. Accordingly, the ECC decoding operation may be performed in a pipelined manner of a single clock cycle.

Figure 3:
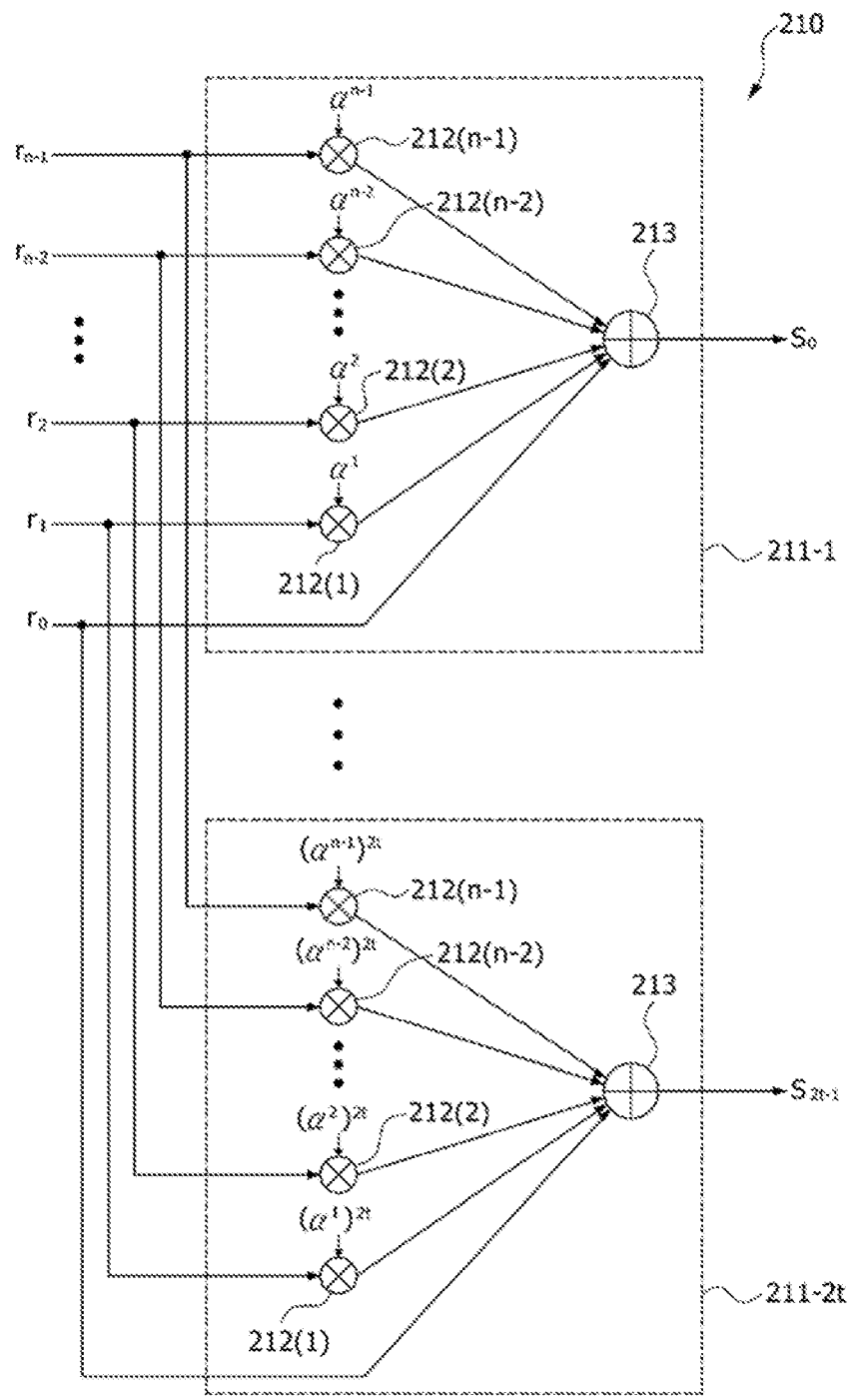
FIG. 3 is a circuit diagram illustrating an example of a syndrome calculator included in the ECC decoder of FIG. 2.

FIG. 3 is a circuit diagram illustrating an example of a syndrome calculator 210 included in the ECC decoder 122 of FIG. 2.

Referring to FIG. 3, the syndrome calculator 210 may include first to $2t^{th}$ syndrome calculation blocks 211-1 to 211-2t in which 't' denotes maximum error correctability representing a maximum number of error-correctable bits. Each of the syndrome calculation blocks 211-1 to 211-2t may receive bit data $r_0$ to $r_{n-1}$ included in an "n"-bit codeword in parallel. In an embodiment, the "n"-bit codeword may include "k"-bit original data and an "(n−k)"-bit parity. Each of the syndrome calculation blocks 211-1 to 211-2t may receive the bit data $r_0$ to $r_{n-1}$ of the "n"-bit codeword in parallel, and the syndrome calculation blocks 211-1 to 211-2t may respectively generate first to $2t^{th}$ syndromes $S_0$ to $S_{2t-1}$ in parallel. Each of the first to $2t^{th}$ syndrome calculation blocks 211-1 to 211-2t may Include first to $(n-1)^{th}$ Galois field multipliers 212(1) to 212(n−1) as well as an exclusive OR (XOR) arithmetic element 213.

The first bit data $r_0$ of the "n"-bit codeword may be directly inputted to the XOR arithmetic element 213. The second bit data $r_1$ of the "n"-bit codeword and a primitive element $a^1$ of a Galois field may be inputted to the first Galois field multiplier 212(1) of the first syndrome calculation block 211-1. The third bit data $r_2$ of the "n"-bit codeword and a primitive element $a^2$ of the Galois field may be inputted to the second Galois field multiplier 212(2) of the first syndrome calculation block 211-1. The $(n-1)^{th}$ bit data $r_{n-2}$ of the "n"-bit codeword and a primitive element $a^{n-2}$ of the Galois field may be inputted to the $(n-2)^{th}$ Galois field multiplier 212(n−2) of the first syndrome calculation block 211-1. The $n^{th}$ bit data $r_{n-1}$ of the "n"-bit codeword and a primitive element $a^{n-1}$ of the Galois field may be inputted to the $(n-1)^{th}$ Galois field multiplier 212(n−1) of the first syndrome calculation block 211-1.

Output data of the first to $(n-1)^{th}$ Galois field multipliers 212(1) to 212(n−1) of the first syndrome calculation block 211-1 and the first bit data $r_0$ of the "n"-bit codeword may be inputted to the XOR arithmetic element 213 of the first syndrome calculation block 211-1. The XOR arithmetic element 213 of the first syndrome calculation block 211-1 may perform XOR operations of the output data of the first to $(n-1)^{th}$ Galois field multipliers 212(1) to 212(n−1) and the first bit data $r_0$ of the "n"-bit codeword to generate the first syndrome $S_0$.

Similarly, the second bit data $r_1$ of the "n"-bit codeword and a primitive element $(a^1)^{2t}$ of the Galois field may be inputted to the first Galois field multiplier 212(1) of the $2t^{th}$ syndrome calculation block 211-2$t$. The third bit data $r_2$ of the "n"-bit codeword and a primitive element $(a^2)^{2t}$ of the Galois field may be inputted to the second Galois field multiplier 212(2) of the $2t^t$ syndrome calculation block 211-2$t$. The $(n-1)^{th}$ bit data $r_{n-2}$ of the "n"-bit codeword and a primitive element $(a^{n-2})^{2t}$ of the Galols field may be inputted to the $(n-2)^{th}$ Galois field multiplier 212($n-2$) of the $2t^{th}$ syndrome calculation block 211-2$t$. The $n^{th}$ bit data $r_{n-1}$ of the "n"-bit codeword and a primitive element $(a^{n-1})^{2t}$ of the Galois field may be inputted to the $(n-1)^{th}$ Galois field multiplier 212($n-1$) of the $2t^{th}$ syndrome calculation block 211-2$t$.

Output data of the first to $(n-1)^{th}$ Galois field multipliers 212(1) to 212($n-1$) of the $2t^{th}$ syndrome calculation block 211-2$t$ and the first bit data $r_0$ of the "n"-bit codeword may be inputted to the XOR arithmetic element 213 of the $2t^{th}$ syndrome calculation block 211-2$t$. The XOR arithmetic element 213 of the $2t^{th}$ syndrome calculation block 211-2$t$ may perform XOR operations of the output data of the first to $(n-1)^{th}$ Galois field multipliers 212(1) to 212($n-1$) and the first bit data $r_0$ of the "n"-bit codeword to generate the $2t^{th}$ syndrome $S_{2t-1}$.

As described above, each of the first to $2t^{th}$ syndrome calculation blocks 211-1 to 211-2$t$ may be comprised of only a combinational logic circuit including the first to $(n-1)^{th}$ Galois field multipliers 212(1) to 212($n-1$) and the XOR arithmetic element 213 without any sequential logic circuits such as flip-flops.

The first to $2t^{th}$ syndrome calculation blocks 211-1 to 211-2$t$ may receive the bit data $r_0$ to $r_{n-1}$ of the "n"-bit codeword in parallel to generate the first to $2t^{th}$ syndromes $S_0$ to $S_{2t-1}$ in parallel. Accordingly, the syndrome generation operation performed may be executed for one clock cycle by the first to $2t^{th}$ syndrome calculation blocks 211-1 to 211-2$t$. Thus, a total ECC decoding operation may be performed in a pipelined manner of a single clock cycle.

Figure 4:
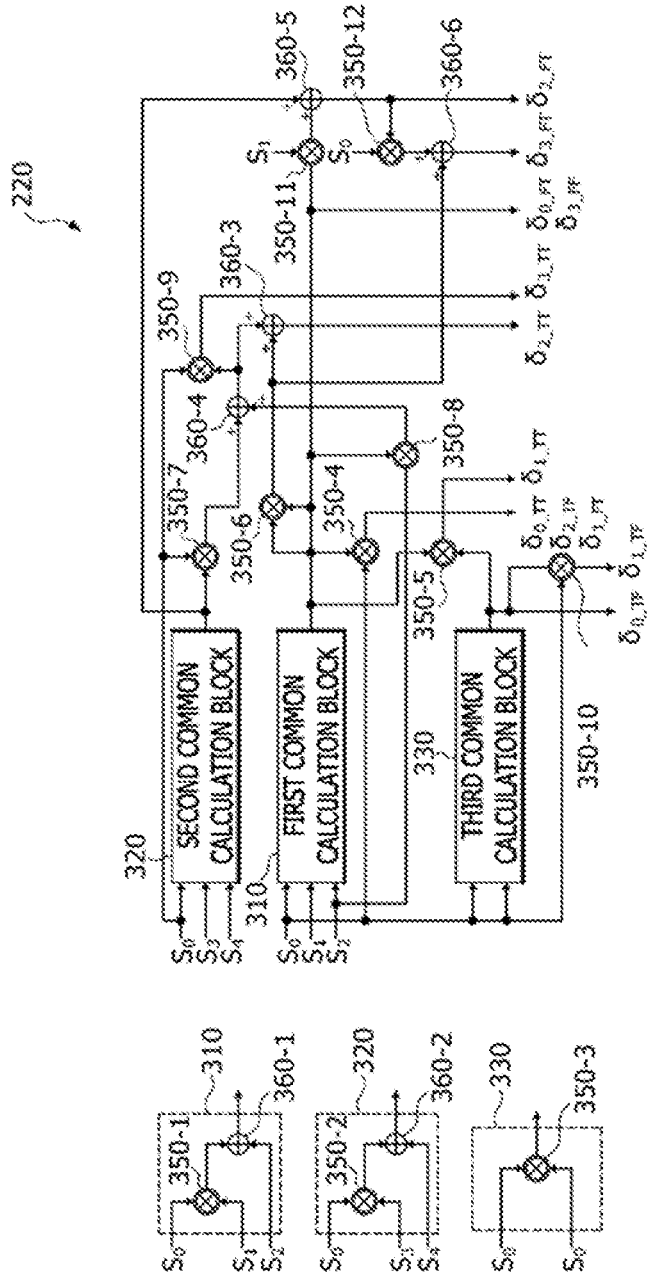
FIG. 4 is a circuit diagram illustrating an example of an error location polynomial calculator included in the ECC decoder of FIG. 2.

FIG. 4 is a circuit diagram illustrating an example of the error location polynomial calculator 220 included in the ECC decoder 122 of FIG. 2, and FIGS. 5 to 9 illustrate pre-calculation steps for obtaining coefficients corresponding to output data of the error location polynomial calculator 220 shown in FIG. 4.

The error location polynomial calculator 220 may output coefficients $\delta_i(t)$ (where, i=0, 1, . . . , t) of the error location polynomial under each of a plurality of conditions through the Galois field multiplying operations and the XOR operations of the first to $(2t-1)^{th}$ syndromes $S_0$ to $S_{2t-1}$ which are provided according to a simplified inversionless Berlekamp-Massey (SiBM) algorithm. The number of conditions may be set to be "$2^{(t-1)}$". As a result, the total number of the coefficients generated by the error location polynomial calculator 220 may be "$2^{(t-1)} \times (t+1)$".

The error location polynomial calculator 220 according to the present embodiment may be available if the maximum error correctability "t" is three, which is merely an example. That is, the error location polynomial calculator 220 may be easily modified to provide an error location polynomial calculator which is available for various maximum error correctability "t". If the maximum error correctability "t" is three, first to $(2t-1)^{th}$ syndromes, that is, five syndromes $S_0$ to $S_4$ may be inputted to the error location polynomial calculator 220. In such a case, the error location polynomial calculator 220 may output "(t+1)"-number of coefficients, that is, four error location polynomial coefficients for each of first to fourth conditions TT, TF, FT and FF. Since four error location polynomial coefficients for each of the first to fourth conditions TT, TF, FT and FF are outputted from the error location polynomial calculator 220, the error location polynomial calculator 220 may output substantially sixteen error location polynomial coefficients.

Only twelve coefficients among the sixteen error location polynomial coefficients may be generated by an operation of the error location polynomial calculator 220. Accordingly, four error location polynomial coefficients that is, $\delta_3(3)$, $\delta_2(3)$, $\delta_0(3)$, and $\delta_1(3)$, obtained without calculation of the error location polynomial calculator 220 are omitted in FIG. 4, but will be described later.

Each of the sixteen error location polynomial coefficients outputted from the error location polynomial calculator 220 may be represented by an equation expressed by only Galois field multiplying operations and XOR operations through pre-calculation steps using the SiBM algorithm. The pre-calculation steps will be described in detail hereinafter with reference to FIGS. 5 to 9.

Referring to FIG. 5, an initialization step and an input step may be performed. Specifically, error location polynomial coefficients $\delta_5(0)$ to $\delta_8(0)$ necessary for calculation of error location polynomial coefficients $\delta_0(1)$ to $\delta_6(1)$ to be calculated at a first operation round ("r=0" of FIG. 6) may be set to have values of "0", "1", "0" and "0", respectively. In addition, an initial value k(0) of a control signal k and an initial value γ(0) of a control signal γ may be set to have values of "0" and "1", respectively. Variables $\theta_5(0)$ to $\theta_7(0)$ used in calculation of the error location polynomial coefficients may be set to have values of "0", "1" and "0", respectively. Moreover, the first to fifth syndromes $S_i$(where, i=0, 1, 2, 3, 4) may be inputted as initial values of the error location polynomial coefficients $\delta_i(0)$ (where, i=0, 1, 2, 3, 4), respectively. Furthermore, the first to fifth syndromes $S_i$ (where, i=0, 1, 2, 3, 4) may be inputted as values of variables $\theta_i(0)$ (where, i=0, 1, 2, 3, 4).

Referring to FIG. 6, a first step SiBM1 of the first operation round "(r=0)" may be performed after the initialization step and the input step terminates. The first step SiBM1 may calculate the error location polynomial coefficients $\delta_0(1)$ to $\delta_6(1)$ using the data which are set at the initialization step and the input step. For example, since the data "1", "$S_2$", "$S_0$" and "$S_1$" are respectively set as the values of the variables γ(0), $\delta_2(0)$, $\delta_0(0)$ and $\theta_1(0)$ at the initialization step and the input step, the error location polynomial coefficient $\delta_0(1)$ may be calculated as "$S_2$+$S_0 \cdot S_1$" which is expressed by the syndromes "$S_2$", "$S_0$" and "$S_1$".

As such, the remaining error location polynomial coefficients $\delta_i(1)$ to $\delta_6(1)$ may also be calculated in the same manner so that each of the remaining error location polynomial coefficients $\delta_1(1)$ to $\delta_6(1)$ is expressed by "0", "1" and/or the syndromes.

A second step SiBM2 may be performed after the first step SiBM1 terminates. At the second step SiBM2, a first high-order condition and a second high-order condition may be set and variables for each of the first and second high-order conditions may be set.

The first high-order condition may correspond to a case in which the error location polynomial coefficient $\delta_0(0)$ is not "0" and the control signal k(0) is equal to or greater than "0". The second high-order condition may correspond to a case in which the error location polynomial coefficient $\delta_0(0)$ is "0" or the control signal k(0) is less than "0".

Since the control signal k(0) is initialized to have a value of "0" at the initialization step, the first high-order condition and the second high-order condition may be distinct from each other according to whether or not the error location polynomial coefficient $\delta_0(0)$ is "0".

In case of the first high-order condition, the variables $\theta_0(1)$, $\theta_1(1)$, $\theta_2(1)$, $\theta_5(1)$ and $\theta_6(1)$ may be set to have values of "$S_1$", "$S_2$", "$S_3$", "1" and "0" respectively, and the control signals $\gamma(1)$ and $k(1)$ may be set to have values of "$S_0$" and "0" respectively.

In case of the second high-order condition, the variables $\theta_0(1)$, $\theta_1(1)$, $\theta_2(1)$, $\theta_5(1)$ and $\theta_6(1)$ may be set to have values of "$S_0$", "$S_1$", "$S_2$", "0" and "1" respectively, and both of the control signals $\gamma(1)$ and $k(1)$ may be set to have a value of "1". In the first and second high-order conditions, both of the variables $\theta_3(1)$ and $\theta_4(1)$ may be set to have a value of "0".

Referring to FIG. 7, a second operation round "(r=1)" may be performed after the first operation round "(r=0)" terminates. The second operation round "(r=1)" may include a first step SiBM3 and a second step (SiBM4 of FIG. 8). The error location polynomial coefficients $\delta_0(2)$ to $\delta_6(2)$ may be calculated under each of the first and second high-order conditions of the first step SiBM3. For example, since the variables $\gamma(1)$, $\delta_2(1)$, $\delta_0(1)$ and $\theta_1(1)$ of the error location polynomial coefficient $\delta_0(2)$ are calculated at the first and second steps SiBM1 and SiBM2 of the first operation round "(r=0)", the error location polynomial coefficient $\delta_0(2)$ may be calculated as "$S_0 \cdot (S_4 + S_0 \cdot S_3) + (S_2 + S_0 \cdot S_1) \cdot S_2$" which is expressed by the syndromes "$S_0$", "$S_4$", "$S_3$", "$S_2$" and "$S_1$".

As such, the remaining error location polynomial coefficients $\delta_1(2)$ to $\delta_6(2)$ may also be calculated in the same manner so that each of the remaining error location polynomial coefficients $\delta_1(2)$ to $\delta_6(2)$ is expressed by "0", "1" and/or the syndromes.

Under the second high-order condition, the same calculations as described above may also be performed to obtain the error location polynomial coefficients $\delta_0(2)$ to $\delta_6(2)$.

Referring to FIG. 8, the second step SiBM4 may be performed after the first step SiBM3 terminates. At the second step SiBM4, a third high-order condition and a fourth high-order condition may be set and variables for each of the third and fourth high-order conditions may be set.

The third high-order condition may correspond to a case in which the error location polynomial coefficient $\delta_0(1)$ is not "0" and the control signal $k(1)$ is equal to or greater than "0". The fourth high-order condition may correspond to a case that the error location polynomial coefficient $\delta_0(1)$ is "0" or the control signal $k(1)$ is less than "0".

Since the control signal $k(1)$ is equal to or greater than "0", the third high-order condition and the fourth high-order condition may be distinct from each other according to whether or not the error location polynomial coefficient $\delta_0(1)$ is "0".

In case of the third high-order condition, the variables $\theta_0(2)$, $\theta_3(2)$, $\theta_4(2)$, $\theta_5(2)$ and $\theta_6(2)$ may be set to have values of "$S_3 + S_0 \cdot S_2$", "1", "$S_0$", "0" and "0" respectively, and the control signals $\gamma(2)$ and $k(2)$ may be set to have values of "$S_2 + S_0 \cdot S_1$" and "0" respectively. In addition, both of the variables $\theta_1(2)$ and $\theta_2(2)$ may be set to have a value of "0".

The first condition TT may be defined as a case that meets the first and third high-order conditions. That is, the first condition TT may correspond to a case in which both of the error location polynomial coefficients $\delta_0(0)$ and $\delta_0(1)$ are not "0" and both of the control signals $k(0)$ and $k(1)$ are equal to or greater than "0". The third condition FT may be defined as a case that meets the second and third fourth high-order conditions. The third condition FT may correspond to a case in which the error location polynomial coefficient $\delta_0(0)$ is "0" or the control signals $k(0)$ is less than "0", the error location polynomial coefficient $\delta_0(1)$ is not "0", and the control signal $k(1)$ is equal to or greater than "0".

The fourth high-order condition may include a first case that satisfies the first high-order condition and a second case that satisfies the second high-order condition. The fourth high-order condition satisfying the first high-order condition may correspond to a case in which the error location polynomial coefficient $\delta_0(0)$ is not "0", the control signal $k(0)$ is equal to or greater than "0", and the error location polynomial coefficient $\delta_0(1)$ is "0" or the control signal $k(1)$ is less than "0". The fourth high-order condition satisfying the second high-order condition may correspond to a case that the error location polynomial coefficient $\delta_0(0)$ Is "0" or the control signal $k(O)$ is less than "0", and the error location polynomial coefficient $\delta_0(1)$ is "0" or the control signal $k(1)$ is less than "0".

The second condition TF may correspond to the fourth high-order condition satisfying the first high-order condition, and the fourth condition FF may correspond to the fourth high-order condition satisfying the second high-order condition.

In case of the second condition TF, the variables $\theta_0(2)$, $\theta_3(2)$, $\theta_4(2)$, $\theta_5(2)$ and $\theta_6(2)$ may be set to have values of "$S_1$", "0", "0", "1" and "0" respectively, and the control signals $\gamma(2)$ and $k(2)$ may be set to have "$S_0$" and "1" respectively. In addition, both of the variables $\theta_1(2)$ and $\theta_2(2)$ may be set to have a value of "0". In case of the fourth condition FF, the variables $\theta_0(2)$, $\theta_3(2)$, $\theta_4(2)$, $\theta_5(1)$ and $\theta_6(2)$ may be set to have values of "$S_0$", "0", "0", "0" and "1" respectively, and both of the control signals $\gamma(2)$ and $k(2)$ may be set to have a value of "1". In addition, both of the variables $\theta_1(2)$ and $\theta_2(2)$ may be set to have a value of "0".

Referring to FIG. 9, a third operation round "(r=2)" may be performed after the second operation round "(r=1)" terminates. The third operation round "(r=2)" may calculate the error location polynomial coefficients $\delta_0(3)$ to $\delta_3(3)$ for each of the first to fourth conditions TT, TF, FT and FF.

Under the first condition TT, the error location polynomial coefficients $\delta_0(3)$ to $\delta_3(3)$ may be calculated using the error location polynomial coefficients $\delta_0(2)$ to $\delta_6(2)$ obtained under the first high-order condition of the second operation round "(r=1)" and the variables $\theta_0(2)$ to $\theta_6(2)$, $\gamma(2)$ and $k(2)$ set under the third high-order condition of the second operation round "(r=1)". For example, since the data "$S_2 + S_0 \cdot S_1$", "$S_0$", "$S_0 \cdot (S_4 + S_0 \cdot S_3) + (S_2 + S_0 \cdot S_1) \cdot S_2$" and "0" are respectively set as the values of the variables $\gamma(2)$, $\delta_2(2)$, $\delta_0(2)$ and $\theta_1(2)$ of the error location polynomial coefficient $\delta_0(3)$, the error location polynomial coefficient $\delta_0(3)$ may be calculated as "$(S_2 + S_0 \cdot S_1) \cdot S_0$" which is expressed by the syndromes "$S_2$", "$S_0$" and "$S_1$".

As such, the remaining error location polynomial coefficients $\delta_1(3)$ to $\delta_3(3)$ may also be calculated in the same manner so that each of the remaining error location polynomial coefficients $\delta_1(3)$ to $\delta_3(3)$ is expressed by "0", "1" and/or the syndromes.

Under the second condition TF, the error location polynomial coefficients $\delta_0(3)$ to $\delta_3(3)$ may be calculated using the error location polynomial coefficients $\delta_0(2)$ to $\delta_6(2)$ obtained under the first high-order condition of the second operation round "(r=1)" and the variables $\theta_0(2)$ to $\theta_6(2)$, $\gamma(2)$ and $k(2)$ set under the fourth high-order condition satisfying the first high-order condition. For example, since the data "$S_0$", "$S_0$", "$S_0 \cdot (S_4 + S_0 \cdot S_3) + (S_2 + S_0 \cdot S_1) \cdot S_2$" and "0" are respectively set as the values of the variables $\gamma(2)$, $\delta_2(2)$, $\delta_0(2)$ and $\theta_1(2)$ of the error location polynomial coefficient $\delta_0(3)$, the error location polynomial coefficient $\delta_0(3)$ may be calculated as "$S_0 \cdot S_0$" which is expressed by the syndrome "$S_0$".

As such, the remaining error location polynomial coefficients $\delta_1(3)$ to $\delta_3(3)$ may also be calculated in the same manner so that each of the remaining error location polynomial coefficients $\delta_1(3)$ to $\delta_3(3)$ is expressed by "0", "1" and/or the syndromes.

Under the third condition FT, the error location polynomial coefficients $\delta_0(3)$ to $\delta_3(3)$ may be calculated using the error location polynomial coefficients $\delta_0(2)$ to $\delta_6(2)$ obtained under the second high-order condition of the second operation round "(r=1)" and the variables $\theta_0(2)$ to $\theta_6(2)$, $\gamma(2)$ and k(2) set under the third high-order condition. For example, since the data "$S_2+S_0 \cdot S_1$", "1", "$(S_4+S_0 \cdot S_3)+(S_2+S_0 \cdot S_1) \cdot S_1$" and "0" are respectively set as the values of the variables $\gamma(2)$, $\delta_2(2)$, $\delta_0(2)$ and $\theta_1(2)$ of the error location polynomial coefficient $\delta_0(3)$, the error location polynomial coefficient $\delta_0(3)$ may be calculated as "$(S_2+S_0 \cdot S_1) \cdot 1$" which is expressed by the syndromes "$S_2$", "$S_0$" and "$S_1$".

As such, the remaining error location polynomial coefficients $\delta_1(3)$ to $\delta_3(3)$ may also be calculated in the same manner so that each of the remaining error location polynomial coefficients $\delta_1(3)$ to $\delta_3(3)$ is expressed by "0", "1" and/or the syndromes.

Under the fourth condition TT, the error location polynomial coefficients $\delta_0(3)$ to $\delta_3(3)$ may be calculated using the error location polynomial coefficients $\delta_0(2)$ to $\delta_6(2)$ obtained under the second high-order condition of the second operation round "(r=1)" and the variables $\theta_0(2)$ to $\theta_6(2)$, $\gamma(2)$ and k(2) set under the fourth high-order condition satisfying the second high-order condition. For example, since the data "1", "1", "$(S_4+S_0 \cdot S_3)+(S_2+S_0 \cdot S_1) \cdot S_1$" and "0" are respectively set as the values of the variables $\gamma(2)$, $\delta_2(2)$, $\delta_0(2)$ and $\theta_1(2)$ of the error location polynomial coefficient $\delta_0(3)$, the error location polynomial coefficient $\delta_0(3)$ may be calculated as "1".

As such, the remaining error location polynomial coefficients $\delta_1(3)$ to $\delta_3(3)$ may also be calculated in the same manner so that each of the remaining error location polynomial coefficients $\delta_1(3)$ to $\delta_3(3)$ is expressed by "0", "1" and/or the syndromes.

As described above, each of the error location polynomial coefficients $\delta_0(3)$ to $\delta_3(3)$ under the first to fourth conditions TT, TF, FT and FF may be expressed by an arithmetic equation including "0", "1" and/or at least one of the syndromes $S_0$, $S_1$, $S_2$, $S_3$ and $S_4$ using the pre-calculation steps illustrated in FIGS. 5 to 9. Thus, the error location polynomial calculator 220 may be designed to have a logic circuit which is based on the arithmetic equations of the error location polynomial coefficients $\delta_0(3)$ to $\delta_3(3)$, thereby calculating all of error location polynomials for one clock cycle.

Referring again to FIG. 4, the error location polynomial calculator 220 may include a first common calculation block 310, a second common calculation block 320 and a third common calculation block 330.

Each of the first to third common calculation blocks 310, 320 and 330 may include a logic circuit which is used in calculations of the twelve error location polynomial coefficients in common. Specifically, the first common calculation block 310 may include a first Galois field multiplier 350-1 receiving the first and second syndromes $S_0$ and $S_1$ as input data and a first XOR arithmetic element 360-1 receiving an output data of the first Galois field multiplier 350-1 and the third syndrome $S_2$ as input data. The second common calculation block 320 may include a second Galois field multiplier 350-2 receiving the first and fourth syndromes $S_0$ and $S_3$ as input data and a second XOR arithmetic element 360-2 receiving an output data of the second Galois field multiplier 350-2 and the fifth syndrome $S_4$ as input data. The third common calculation block 330 may include a third Galois field multiplier 350-3 having two input terminals to which the first syndrome $S_0$ is simultaneously applied.

The first common calculation block 310 may perform a Galois field multiplying operation of the first and second syndromes $S_0$ and $S_1$, and may perform an XOR operation of the Galois field multiplying operation result and the third $S_2$ to output the XOR operation result.

Thus, the first common calculation block 310 may perform an operation corresponding to an equation "$S_2+S_0 \cdot S_1$". As illustrated in FIG. 9, the operation corresponding to the equation "$S_2+S_0 \cdot S_1$" may be performed in common in calculation of all of the error location polynomial coefficients $\delta_0(3)$ to $\delta_3(3)$ under the first condition TT, in calculation of the error location polynomial coefficients $\delta_2(3)$ under the second condition TF, in calculation of all of the error location polynomial coefficients $\delta_0(3)$ to $\delta_3(3)$ under the third condition FT, and in calculation of the error location polynomial coefficients $\delta_3(3)$ under the fourth condition FF. Accordingly, an output signal of the first common calculation block 310 may be used in calculation of all of the error location polynomial coefficients including the equation "$S_2+S_0 \cdot S_1$".

The second common calculation block 320 may perform a Galois field multiplying operation of the first and fourth syndromes $S_0$ and $S_3$ and may perform an XOR operation of the Galois field multiplying operation result and the fifth $S_4$ to output the XOR operation result. Thus, the second common calculation block 320 may perform an operation corresponding to an equation "$S_4+S_0 \cdot S_3$". As illustrated in FIG. 9, the operation corresponding to the equation "$S_4+S_0 \cdot S_3$" may be performed in common in calculation of the error location polynomial coefficients $\delta_2(3)$ and $\delta_3(3)$ under the first condition TT and in calculation of the error location polynomial coefficients $\delta_2(3)$ and $\delta_3(3)$ under the third condition FT. Accordingly, an output signal of the second common calculation block 320 may be used in the calculation of all of the error location polynomial coefficients including the equation "$S_4+S_0 \cdot S_3$".

The third common calculation block 330 may perform a Galois field multiplying operation of the first syndrome $S_0$ and the first syndrome $S_0$ to output the Galois field multiplying operation result. Thus, the third common calculation block 330 may perform an operation corresponding to an equation "$S_0 \cdot S_0$". As illustrated in FIG. 9, the operation corresponding to the equation "$S_0 \cdot S_0$" may be performed in common in calculation of the error location polynomial coefficient $\delta_1(3)$ under the first condition TT and in calculation of the error location polynomial coefficients $\delta_0(3)$ and $\delta_1(3)$ under the second condition TF. Accordingly, an output signal of the third common calculation block 330 may be used in the calculation of all of the error location polynomial coefficients including the equation "$S_0 \cdot S_0$".

In FIG. 4, output signals of the error location polynomial calculator 220 may include first output signals $\delta_0\_TT$, $\delta_1\_TT$, $\delta_2\_TT$ and $\delta_3\_TT$, second output signals $\delta_0\_TF$, $\delta_1\_TF$ and $\delta_2\_TF$, third output signals $\delta_0\_FT$, $\delta_1\_FT$, $\delta_2\_FT$ and $\delta_3\_FT$, and a fourth output signal $\delta_3\_FF$.

The first output signals $\delta_0\_TT$, $\delta_1\_TT$, $\delta_2\_TT$ may correspond to the error location polynomial coefficients $\delta_0(3)$, $\delta_1(3)$, $\delta_2(3)$ and $\delta_3(3)$ under the first condition TT, respectively. The second output signals $\delta_0\_TF$, $\delta_1\_TF$ and $\delta_2\_TF$ may correspond to the error location polynomial coefficients $\delta_0(3)$, $\delta_1(3)$ and $\delta_2(3)$ under the second condition TF, respectively. The third output signals $\delta_0\_FT$, $\delta_1\_FT$, $\delta_2\_FT$ and $\delta_3\_FT$ may correspond to the error location polynomial coefficients $\delta_0(3)$, $\delta_1(3)$, $\delta_2(3)$ and $\delta_3(3)$ under the third condition FT, respectively. The fourth output signal $\delta_3\_FF$ may correspond to the error location polynomial coefficient $\delta_3(3)$ under the fourth condition FF.

The error location polynomial coefficient $\delta_3(3)$ having a value of "0" under the second condition TF and the error location polynomial coefficient $\delta_2(3)$ having a value of "0" under the fourth condition FF are omitted in FIG. 4. In addition, the error location polynomial coefficient $\delta_0(3)$ having a value of "1" under the fourth condition FF is omitted in FIG. 4. Moreover, the error location polynomial coefficient $\delta_1(3)$ having a value of the first syndrome $S_0$ under the fourth condition FF is omitted in FIG. 4.

An output signal of the first common calculation block 310 may be the fourth output signal $\delta_3\_FF$, that is, the error location polynomial coefficient $\delta_3(3)$ under the fourth condition FF. An output signal of the third common calculation block 330 may be the second output signal $\delta_0\_TF$, that is, the error location polynomial coefficient $\delta_0(3)$ under the second condition TF.

The error location polynomial calculator 220 may further include fourth to twelfth Galois field multipliers 350-4 to 350-12 and third to sixth XOR arithmetic elements 360-3 to 360-6 which are coupled between output terminals of the first to third common calculation blocks 310 to 330 and output terminals of the error location polynomial calculator 220.

The fourth Galois field multiplier 350-4 may perform a Galois field multiplying operation of the first syndrome $S_0$ and an output signal "$S_2+S_0 \cdot S_1$" of the first common calculation block 310. As a result, an output signal of the fourth Galois field multiplier 350-4 may be the first output signal $S_0\_TT$, that is, the error location polynomial coefficient $\delta_0(3)$ under the first condition TT. The fifth Galois field multiplier 350-5 may perform a Galois field multiplying operation of an output signal "$S_2+S_0 \cdot S_1$" of the first common calculation block 310 and an output signal "$S_0 \cdot S_0$" of the third common calculation block 330. As a result, an output signal of the fifth Galois field multiplier 350-5 may be the first output signal $\delta_1\_TT$, that is, the error location polynomial coefficient $\delta_1(3)$ under the first condition TT. The sixth Galois field multiplier 350-6 may perform a Galois field multiplying operation of an output signal "$S_2+S_0 \cdot S_1$" of the first common calculation block 310 and an output signal "$S_2+S_0 \cdot S_1$" of the first common calculation block 310. An output signal of the sixth Galois field multiplier 350-6 may be inputted to the third and sixth XOR arithmetic elements 360-3 and 360-6.

The seventh Galois field multiplier 350-7 may perform a Galois field multiplying operation of the first syndrome $S_0$ and an output signal "$S_4+S_0 \cdot S_3$" of the second common calculation block 320. An output signal of the seventh Galois field multiplier 350-7 may be inputted to the fourth XOR arithmetic element 360-4. The eighth Galois field multiplier 350-8 may perform a Galois field multiplying operation of the third syndrome $S_2$ and an output signal "$S_2+S_0 \cdot S_1$" of the first common calculation block 310. An output signal of the eighth Galois field multiplier 350-8 may be inputted to the fourth XOR arithmetic element 360-4. The ninth Galois field multiplier 350-9 may perform a Galois field multiplying operation of the first syndrome $S_0$ and an output signal "$S_0 \cdot (S+S_0 \cdot S_3)+(S_2+S_0 \cdot S_1) S_2$" of the fourth XOR arithmetic element 360-4. An output signal of the ninth Galois field multiplier 350-9 may be the first output signal $\delta_3\_TT$, that is, the error location polynomial coefficient $\delta_3(3)$ under the first condition TT.

The tenth Galois field multiplier 350-10 may perform a Galois field multiplying operation of the first syndrome $S_0$ and an output signal "$S_0 \cdot S_0$" of the third common calculation block 330. An output signal of the tenth Galois field multiplier 350-10 may be the second output signal $\delta_1\_TF$, that is, the error location polynomial coefficient $\delta_1(3)$ under the second condition TF. The eleventh Galois field multiplier 350-11 may perform a Galois field multiplying operation of the second syndrome $S_1$ and an output signal "$S_2+S_0 \cdot S_1$" of the first common calculation block 310. An output signal of the eleventh Galois field multiplier 350-11 may be inputted to the fifth XOR arithmetic element 360-5. The twelfth Galois field multiplier 350-12 may perform a Galois field multiplying operation of the first syndrome $S_0$ and an output signal "$(S_4+S_0 \cdot S_3)+(S_2+S_0 \cdot S_1) \cdot S_1$" of the fifth XOR arithmetic element 360-5. An output signal of the twelfth Galois field multiplier 350-12 may be inputted to the sixth XOR arithmetic element 360-6.

The fourth XOR arithmetic element 360-4 may perform an XOR operation of an output signal "$S_0 (S_4+S_0 \cdot S_3)$" of the seventh Galois field multiplier 350-7 and an output signal "$(S_2+S_0 \cdot S_1) \cdot S_2$" of the eighth Galois field multiplier 350-8. An output signal of the fourth XOR arithmetic element 360-4 may be inputted to the ninth Galois field multiplier 350-9 and the third XOR arithmetic element 360-3. The third XOR arithmetic element 360-3 may receive an output signal "$S_0 \cdot (S_4+S_0 \cdot S_3)+(S_2+S_0 \cdot S_1) \cdot S_2$" of the fourth XOR arithmetic element 360-4 and an output signal "$(S_2+S_0 \cdot S_t)(S_2+S_0 \cdot S_1)$" of the sixth Galois field multiplier 350-6 to perform an XOR operation of the output signal "$S_0 \cdot (S_4+S_0 \cdot S_3)+(S_2+S_0 \cdot S_1) \cdot S_2$" of the fourth XOR arithmetic element 360-4 and the output signal "$(S_2+S_0 \cdot S_1) \cdot (S_2+S_0 \cdot S_1)$" of the sixth Galois field multiplier 350-6. An output signal of the third XOR arithmetic element 360-3 may be the first output signal $\delta_2\_TT$, that is, the error location polynomial coefficient $\delta_2(3)$ under the first condition TT.

The fifth XOR arithmetic element 360-5 may perform an XOR operation of an output signal "$S_4+S_0 \cdot S_3$" of the second common calculation block 320 and an output signal "$(S_2+S_0 \cdot S_1) \cdot S_1$" of the eleventh Galois field multiplier 350-11 and may output the XOR operation result. An output signal of the fifth XOR arithmetic element 360-5 may be the third output signal $\delta_2\_FT$, that is, the error location polynomial coefficient $\delta_2(3)$ under the third condition FT. The sixth XOR arithmetic element 360-6 may perform an XOR operation of an output signal "$(S_2+S_0 \cdot S_1) \cdot (S_2+S_0 \cdot S_1)$" of the sixth Galois field multiplier 350-6 and an output signal "$((S_4+S_0 \cdot S_3)+(S_2+S_0 \cdot S_1) \cdot S_1) \cdot S_0$" of the twelfth Galois field multiplier 350-12 to output the XOR operation result. An output signal of the sixth XOR arithmetic element 360-6 may be the third output signal $\delta_3\_FT$, that is, the error location polynomial coefficient $\delta_3(3)$ under the third condition FT.

As described above, the error location polynomial calculator 220 may perform Galois field multiplying operations with the first to twelfth Galois field multipliers 350-1 to 350-12 and XOR operations with the first to sixth XOR arithmetic elements 360-1 to 360-6 to generate all of the error location polynomial coefficients. While the operations of the error location polynomial calculator 220 are performed, no recursive operation is required. Thus, the error location polynomial calculator 220 may be designed without any sequential logic circuits such as flip-flops and registers. The error location polynomial calculator 220 may receive the syndromes $S_0$ to $S_4$ in parallel and may perform combinational logic operations of the syndromes $S_0$ to $S_4$ using the first to twelfth Galois field multipliers 350-1 to 350-12 and the first to sixth XOR arithmetic elements 360-1 to 360-6 to generate and output the error location polynomial coefficients in parallel. As a result, the error location polynomial coefficients may be generated for one clock cycle.

Figure 10:
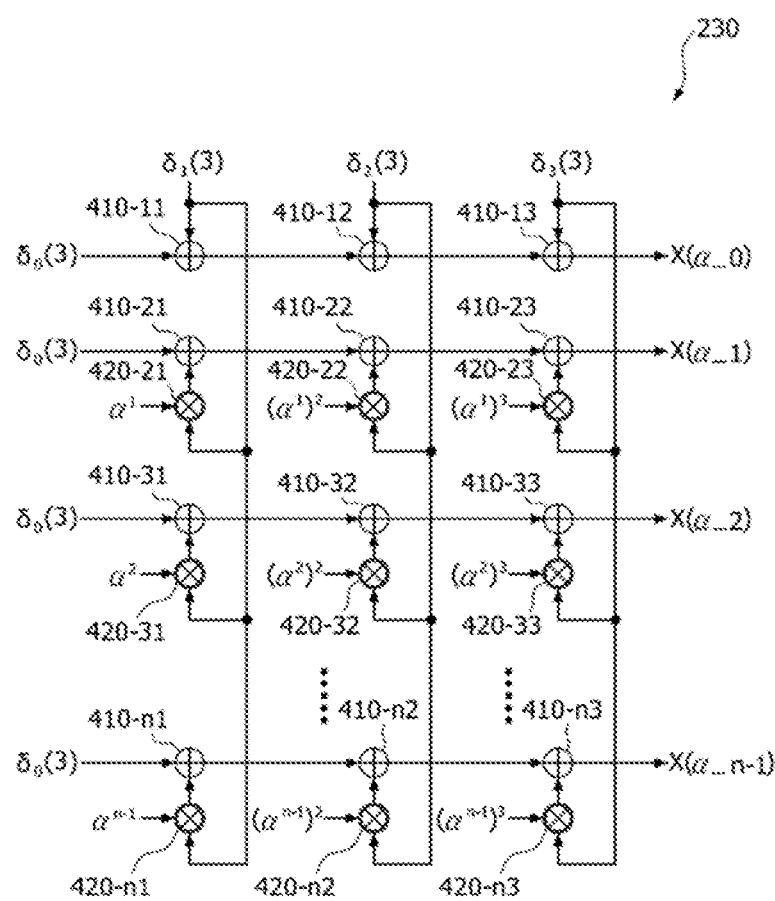
FIG. 10 is a circuit diagram illustrating an example of an error location calculator included in the ECC decoder of FIG. 2.

FIG. 10 is a circuit diagram illustrating an example of the error location calculator 230 included in the ECC decoder 122 of FIG. 2.

Referring to FIG. 10, the error location calculator 230 may perform XOR operations and Galois field multiplying operations to the error location polynomial coefficients $\delta_0(3)$, $\delta_1(3)$, $\delta_2(3)$ and $\delta_3(3)$, which are outputted in parallel from the error location polynomial calculator 220, to generate and output in parallel "n"-bit output data $X(a\_0)$ to $X(a\_n-1)$ including information on error locations. Thus, the error location calculator 230 may perform one cycle of an operation of calculating error locations in response to a single pulse of a clock signal.

The error location calculator 230 may include a plurality of XOR arithmetic elements which are respectively arrayed at cross points of "n"-number of rows and "t"-number of columns and a plurality of Galois field multipliers that provide input signals of the XOR arithmetic elements. If the maximum error correctability "t" is three, the error location calculator 230 may include "3n"-number of XOR arithmetic elements 410-11 to 410-$n$3 which are respectively arrayed at cross points of "n"-number of rows and three columns. In addition, the error location calculator 230 may include "(3n-3)"-number of Galois field multipliers 420-21 to 420-$n$3 that provide input signals of the XOR arithmetic elements 410-21 to 410-$n$3 which are arrayed in the second to $n^{th}$ rows.

The error location polynomial coefficient $\delta_0(3)$ may be Inputted to the XOR arithmetic elements 410-11 to 410-$n$1 which are arrayed in the first column. Output data of the XOR arithmetic elements 410-11 to 410-$n$1 may be respectively inputted to the XOR arithmetic elements 410-12 to 410-$n$2 which are arrayed in the second column. Output data of the XOR arithmetic elements 410-12 to 410-$n$2 may be respectively inputted to the XOR arithmetic elements 410-13 to 410-$n$3 which are arrayed in the third column. The XOR arithmetic elements 410-13 to 410-$n$3 may output the "n"-bit output data $X(a\_0)$ to $X(a\_n-1)$, respectively. Erroneous bits of the "n"-bit output data $X(a\_0)$ to $X(a\_n-1)$ may have a value of "1", and non-erroneous bits of the "n"-bit output data $X(a\_0)$ to $X(a\_n-1)$ may have a value of "0".

The error location polynomial coefficient $\delta_1(3)$ may be inputted to the XOR arithmetic element 410-11 which is located at a cross point of the first row and the first column. The error location polynomial coefficient $\delta_2(3)$ may be inputted to the XOR arithmetic element 410-12 which is located at a cross point of the first row and the second column. In addition, the error location polynomial coefficient $\delta_3(3)$ may be inputted to the XOR arithmetic element 410-13 which is located at a cross point of the first row and the third column. The error location polynomial coefficient $\delta_1(3)$ may be inputted to all of the Galois field multipliers 420-21 to 420-$n$1, which are arrayed in the first column. The error location polynomial coefficient $\delta_2(3)$ may be inputted to all of the Galois field multipliers 420-22 to 420-$n$2, which are arrayed in the second column. The error location polynomial coefficient $\delta_3(3)$ may be inputted to all of the Galois field multipliers 420-23 to 420-$n$3, which are arrayed in the third column. The primitive elements $a^1$ to $a^{(n-1)}$ of the Galois field may be inputted to the Galois field multipliers 420-21 to 420-$n$1 arrayed in the first column, respectively. The primitive elements $(a^1)^2$ to $(a^{n-1})^2$ of the Galois field may be inputted to the Galois field multipliers 420-22 to 420-$n$2 arrayed in the second column, respectively. The primitive elements $(a^1)^3$ to $(a^{n-1})^3$ of the Galois field may be inputted to the Galois field multipliers 420-23 to 420-$n$3 arrayed in the third column, respectively.

Figure 11:
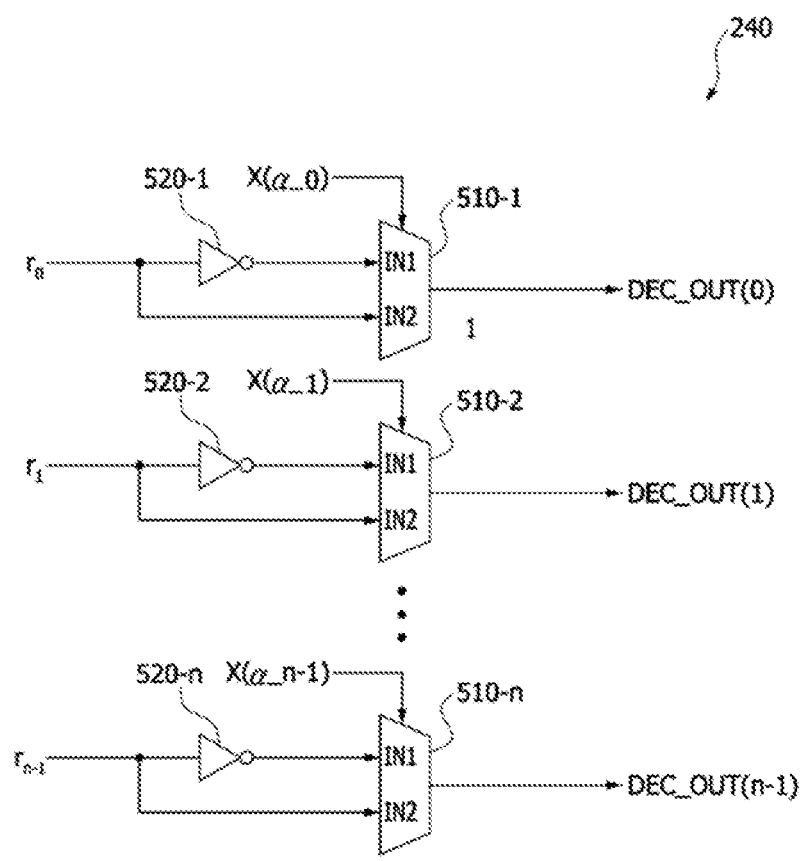
FIG. 11 is a circuit diagram illustrating an example of an error corrector included in the ECC decoder of FIG. 2.

FIG. 11 is a circuit diagram illustrating an example of the error corrector 240 included in the ECC decoder 122 of FIG. 2.

Referring to FIG. 11, the error corrector 240 may include first to $n^{th}$ multiplexers 510-1 to 510-$n$ and first to $n^{th}$ inverters 520-1 to 520-$n$. The multiplexers 510-1 to 510-$n$ may generate first to $n^{th}$ decoded output data DEC_OUT(0) to DEC_OUT(n-1), respectively. Each of the decoded output data DEC_OUT(0) to DEC_OUT(n-1) may have a value of "1" or "0". The error corrector 240 may receive the bit data $r_0$ to $r_{n-1}$ of the "n"-bit codeword and the "n"-bit output data $X(a\_0)$ to $X(a\_n-1)$ outputted in parallel from the error location calculator 230 and may perform an error correction operation of the "n"-bit codeword to output the "n"-bit decoded output in parallel data DEC_OUT(O) to DEC_OUT(n-1) corresponding to corrected data. Accordingly, the error corrector 240 may perform the error correction operation of the "n"-bit codeword for one clock cycle.

The first multiplexer 510-1 may have a first input terminal IN1 to which an output signal of the first inverter 520-1 receiving the first bit data $r_0$ of the "n"-bit codeword is inputted and a second input terminal IN2 to which the first bit data $r_0$ of the "n"-bit codeword is directly inputted. The second multiplexer 510-2 may have a first input terminal IN1 to which an output signal of the second Inverter 520-2 receiving the second bit data $r_1$ of the "n"-bit codeword is inputted and a second input terminal IN2 to which the second bit data $r_1$ of the "n"-bit codeword is directly inputted. Similarly, the $n^{th}$ multiplexer 510-$n$ may have a first input terminal IN1 to which an output signal of the $n^{th}$ inverter 520-$n$ receiving the $n^{th}$ bit data $r_{n-1}$ of the "n"-bit codeword is inputted and a second input terminal IN2 to which the $n^{th}$ bit data $r_{n-1}$ of the "n"-bit codeword is directly inputted.

The "n"-bit decoded output data DEC_OUT(0) to DEC_OUT(n-1) outputted from the first to $n^{th}$ multiplexers 510-1 to 510-$n$ may be determined by the "n"-bit output data $X(a\_0)$ to $X(a\_n-1)$ outputted from the error location calculator 230, respectively.

The first bit of output data $X(a\_0)$ outputted from the error location calculator 230 may be inputted to the first multiplexer 510-1 to act as a control signal of the first multiplexer 510-1. If the first bit of output data $X(a\_0)$ is "1", the first bit data $r_0$ of the "n"-bit codeword may correspond to an erroneous bit data. Thus, the first multiplexer 510-1 may output an inverted signal of the first bit data $r_0$ of the codeword that is, a signal inputted to the first input terminal IN1 of the first multiplexer 510-1 as the first bit of decoded output data DEC_OUT(O). In contrast, if the first bit of output data $X(a\_0)$ is "0", the first bit data $r_0$ of the "n"-bit codeword may correspond to a non-erroneous bit data. Thus, the first multiplexer 510-1 may output the first bit data $r_0$ of the codeword that is, a signal inputted to the second input terminal IN2 of the first multiplexer 510-1 as the first bit of decoded output data DEC_OUT(0).

The second bit of output data $X(a\_1)$ outputted from the error location calculator 230 may be inputted to the second multiplexer 510-2 to act as a control signal of the second multiplexer 510-2. If the second bit of output data $X(a\_1)$ is "1", the second bit data $r_1$ of the "n"-bit codeword may correspond to an erroneous bit data. Thus, the second multiplexer 510-2 may output an inverted signal of the second bit data $r_1$ of the codeword that is, a signal inputted to the first input terminal IN1 of the second multiplexer 510-2, as the second bit of decoded output data DEC_OUT (1). In contrast, if the second bit of output data X(a_1) is "0", the second bit data $r_1$ of the "n"-bit codeword may correspond to a non-erroneous bit data. Thus, the second multiplexer 510-2 may output the second bit data $r_1$ of the codeword that is, a signal inputted to the second input terminal IN2 of the second multiplexer 510-2, as the second bit of decoded output data DEC_OUT(1).

Similarly, The $n^{th}$ bit of output data X(a_n−1) outputted from the error location calculator 230 may be inputted to the $n^{th}$ multiplexer 510-$n$ to act as a control signal of the $n^{th}$ multiplexer 510-$n$. If the $n^h$ bit of output data X(a_n−1) is "1", the $n^{th}$ bit data $r_{n-1}$ of the "n"-bit codeword may correspond to an erroneous bit data. Thus, the $n^{th}$ multiplexer 510-$n$ may output an inverted signal of the $n^{th}$ bit data $r_{n-1}$ of the codeword that is, a signal inputted to the first input terminal IN1 of the $n^{th}$ multiplexer 510-$n$ as the $n^{th}$ bit of decoded output data DEC_OUT(n−1). In contrast, if the nm bit of output data X(a_n−1) is "0", the $n^{th}$ bit data $r_{n-1}$ of the "n"-bit codeword may correspond to a non-erroneous bit data. Thus, the $n^{th}$ multiplexer 510-$n$ may output the $n^{th}$ bit data $r_{n-1}$ of the codeword that is, a signal inputted to the second input terminal IN2 of the $n^{th}$ multiplexer 510-$n$ as the $n^{th}$ bit of decoded output data DEC_OUT(n−1).

Figure 12:
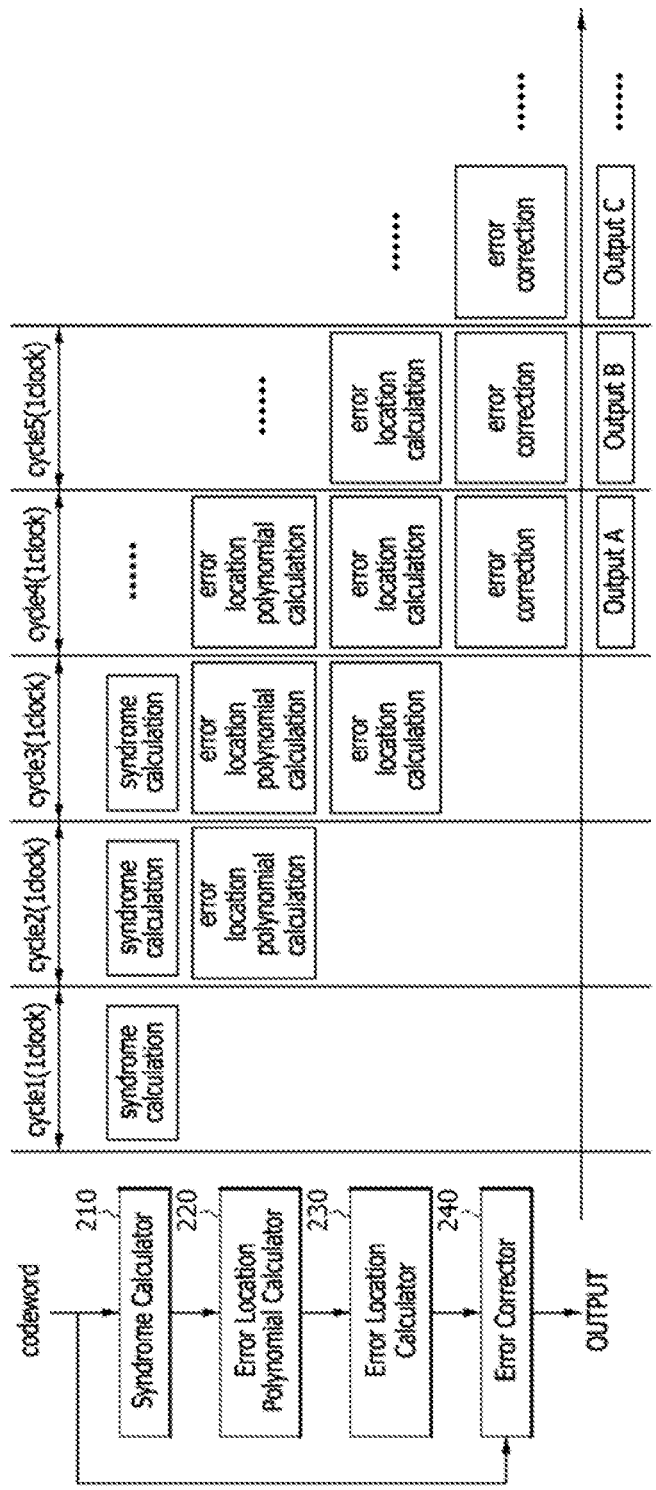
FIG. 12 is a schematic view illustrating a pipelined operation of the ECC decoder of FIG. 2.

FIG. 12 is a schematic view illustrating a pipelined operation of the ECC decoder 122 of FIG. 2.

Referring to FIG. 12, when an ECC decoding operation starts, the syndrome calculator 210 may perform a syndrome calculation of a first codeword during a first clock cycle. As described with reference to FIG. 3, the syndrome calculator 210 may perform the syndrome calculation for one clock cycle. When the syndrome calculation of the first codeword terminates, the syndrome calculator 210 may perform a syndrome calculation of a second codeword during a second clock cycle. When the syndrome calculation of the second codeword terminates, the syndrome calculator 210 may perform a syndrome calculation of a third codeword during a third clock cycle. The syndrome calculator 210 may also perform each of subsequent syndrome calculations during a single clock cycle after the third clock cycle.

During the second clock cycle after the syndrome calculation of the first codeword terminates, the error location polynomial calculator 220 may calculate and output the error location polynomial coefficients using syndromes generated by the syndrome calculation of the syndrome calculator 210 during the first clock cycle. As described with reference to FIGS. 4 to 9, the error location polynomial calculator 220 may perform the error location polynomial calculation operation for one clock cycle. During the third clock cycle, the error location polynomial calculator 220 may calculate and output the error location polynomial coefficients using syndromes generated by the syndrome calculation of the syndrome calculator 210 during the second clock cycle. Similarly, during the fourth clock cycle, the error location polynomial calculator 220 may calculate and output the error location polynomial coefficients using syndromes generated by the syndrome calculation of the syndrome calculator 210 during the third clock cycle. The error location polynomial calculator 220 may perform each of the subsequent error location polynomial calculation operations during a single clock cycle after the fourth clock cycle.

During the third clock cycle after the error location polynomial calculation of the first codeword terminates, the error location calculator 230 may calculate the error locations using the error location polynomial coefficients generated by the error location polynomial calculator 220 during the second clock cycle. As described with reference to FIG. 10, the error location calculator 230 may perform the error location calculation for one clock cycle. During the fourth clock cycle, the error location calculator 230 may calculate and output the error locations using the error location polynomial coefficients generated by the error location polynomial calculator 220 during the third clock cycle. Similarly, during the fifth clock cycle, the error location calculator 230 may calculate and output the error locations using the error location polynomial coefficients generated by the error location polynomial calculator 220 during the fourth clock cycle. The error location calculator 230 may perform each of the subsequent error location calculation operations during a single clock cycle after the fifth clock cycle.

During the fourth clock cycle after the error location calculation of the first codeword terminates, the error corrector 240 may generate first decoded data OUTPUT_A corresponding to the first codeword, using the output data outputted from the error location calculator 230 during the third clock cycle. As described with reference to FIG. 11, the error corrector 240 may perform the error correction operation for one clock cycle. During the fifth clock cycle, the error corrector 240 may generate second decoded data OUTPUT_B corresponding to the second codeword, using the output data outputted from the error location calculator 230 during the fourth clock cycle. In addition, during the sixth clock cycle, the error corrector 240 may generate third decoded data OUTPUT_C corresponding to the third codeword, using the output data outputted from the error location calculator 230 during the fifth clock cycle. The error corrector 240 may perform each of subsequent error correction operations during a single clock cycle after the sixth clock cycle.

As described above, an ECC decoding operation performed by an error correction circuit according to an embodiment may include a syndrome calculation step, an error location polynomial calculation step, an error location calculation step, and an error correction step which are simultaneously executed during each clock cycle after first to third clock cycles, and the ECC decoding operation may be performed according to a pipelining scheme that outputs decoded output data including a plurality of bits in parallel during each clock cycle. That is, a first syndrome calculation step may be performed during a first clock cycle, a first error location polynomial calculation step may be performed during a second clock cycle after the first clock cycle, and a first error location calculation step may be performed during a third clock cycle after the second clock cycle. In such a case, decoded data of a single codeword may be outputted from the error correction circuit during each clock cycle after the first to third clock cycles.

According to the embodiments, each of various steps constituting an encoding algorithm for error correction using a BCH code may be performed for one clock cycle. Thus, a total encoding operation may be executed in a pipelined manner of a single clock cycle.

The embodiments of the present disclosure have been disclosed above for Illustrative purposes. Those of ordinary skill in the art will appreciate that various modifications, additions, and substitutions are possible, without departing from the scope and spirit of the present disclosure as disclosed in the accompanying claims.

What is claimed is:

1. An error correction circuit comprising: a syndrome calculator suitable for generating syndromes from an "n"-bit codeword for a single unit of time; an error location polynomial calculator suitable for generating error location polynomial coefficients based on the syndromes provided for the single unit of time; an error location calculator suitable for calculating error locations based on the error location polynomial coefficients for the single unit of time; and an error corrector suitable for correcting errors of the codeword based on the error locations for the single unit of time, wherein the error correction circuit operates in a pipelining manner, wherein the error correction circuit receives data from a memory device, and wherein the error correction circuit outputs error corrected data from the memory device to a host.

2. The error correction circuit of claim 1, wherein the syndrome calculator includes a plurality of syndrome calculation blocks; and wherein each of the syndrome calculation blocks includes a plurality of Galois field multipliers and an XOR arithmetic element.

3. The error correction circuit of claim 2,
wherein each of the Galois field multipliers performs a Galois field multiplying operation to one of the "n"-bit codeword other than a first bit and one of primitive elements of a Galois field to output resultant signals to the XOR arithmetic element; and
wherein the XOR arithmetic element performs an XOR operation to the resultant signals of the Galois field multipliers and the first bit of the "n"-bit codeword to output one of the syndromes.

4. The error correction circuit of claim 1, wherein the error location polynomial calculator performs pre-calculated Galois field multiplying operations and XOR operations according to a simplified inversionless Berlekamp-Massey (SiBM) algorithm to generate the error location polynomial coefficients.

5. The error correction circuit of claim 4,
wherein the error location polynomial calculator includes at least one common calculation block, a plurality of Galois field multipliers, and a plurality of XOR arithmetic elements;
wherein the common calculation block performs partial Galois field multiplying operations to the syndromes, the partial Galois field multiplying operations being required in common for calculation of the error location polynomial coefficients;
wherein the plurality of Galois field multipliers perform Galois field multiplying operations to an output signal of the at least one common calculation block, the syndromes, and/or output signals of the plurality of XOR arithmetic elements to output at least one of the error location polynomial coefficients; and
wherein the plurality of XOR arithmetic elements perform XOR operations to an output signal of the at least one common calculation block, the syndromes, and/or output signals of the plurality of Galois field multipliers to output at least one of the error location polynomial coefficients under each of a plurality of conditions.

6. The error correction circuit of claim 5,
wherein the syndromes includes first to fifth syndromes $S_0$, $S_1$, $S_2$, $S_3$ and $S_4$; and
wherein the error location polynomial calculator is suitable for including first to third common calculation blocks, each of which receives at least one of the first to fifth syndromes $S_0$, $S_1$, $S_2$, $S_3$ and $S_4$.

7. The error correction circuit of claim 6,
wherein the first common calculation block includes a first Galois field multiplier receiving the first and second syndromes $S_0$ and $S_1$, and a first XOR arithmetic element receiving an output signal of the first Galois field multiplier and the third syndromes $S_2$ to generate an output signal expressed by an equation "$S_2+S_0 \cdot S_1$";
wherein the second common calculation block includes a second Galois field multiplier receiving the first and fourth syndromes $S_0$ and $S_3$, and a second XOR arithmetic element receiving an output signal of the second Galois field multiplier and the fifth syndromes $S_4$ to generate an output signal expressed by an equation "$S_4+S_0 \cdot S_3$"; and
wherein the third common calculation block includes a third Galois field multiplier having two input terminals receiving the first syndrome $S_0$ to generate an output signal expressed by an equation "$S_0 \cdot S_0$".

8. The error correction circuit of claim 7,
wherein the plurality of conditions include first to fourth conditions;
wherein the first common calculation block outputs an error location polynomial coefficient $\delta_3(3)$ under the fourth condition among the error location polynomial coefficients; and
wherein the third common calculation block outputs an error location polynomial coefficient $\delta_0(3)$ under the second condition among the error location polynomial coefficients.

9. The error correction circuit of claim 8,
wherein the error location polynomial calculator further includes fourth to twelfth Galois field multipliers and third to sixth XOR arithmetic elements;
wherein the fourth Galois field multiplier performs a Galois field multiplying operation of the first syndrome $S_0$ and an output signal "$S_2+S_0 \cdot S_1$" of the first common calculation block to output an error location polynomial coefficient $\delta_0(3)$ under the first condition among the error location polynomial coefficients;
wherein the fifth Galois field multiplier performs a Galois field multiplying operation of an output signal "$S_2+S_0 \cdot S_1$" of the first common calculation block and an output signal "$S_0 \cdot S_0$" of the third common calculation block to output an error location polynomial coefficient $\delta_1(3)$ under the first condition among the error location polynomial coefficients;
wherein the sixth Galois field multiplier may perform a Galois field multiplying operation of an output signal "$S_2+S_0 \cdot S_1$" of the first common calculation block and an output signal "$S_2+S_0 \cdot S_1$" of the first common calculation block to output a result of the Galois field multiplying operation;
wherein the seventh Galois field multiplier performs a Galois field multiplying operation of the first syndrome $S_0$ and an output signal "$S_4+S_0 \cdot S_3$" of the second common calculation block to output a result of the Galois field multiplying operation;
wherein the eighth Galois field multiplier performs a Galois field multiplying operation of the third syndrome $S_2$ and an output signal "$S_2+S_0 \cdot S_1$" of the first common calculation block to output a result of the Galois field multiplying operation;
wherein the ninth Galois field multiplier performs a Galois field multiplying operation of the first syndrome $S_0$ and an output signal of the fourth XOR arithmetic element to output an error location polynomial coefficient $\delta_3(3)$ under the first condition among the error location polynomial coefficients;

wherein the tenth Galois field multiplier performs a Galois field multiplying operation of the first syndrome $S_0$ and an output signal "$S_0 \cdot S_0$" of the third common calculation block to output an error location polynomial coefficient $\delta_1(3)$ under the second condition among the error location polynomial coefficients;

wherein the eleventh Galois field multiplier performs a Galois field multiplying operation of the second syndrome $S_1$ and an output signal "$S_2 + S_0 \cdot S_1$" of the first common calculation block to output a result of the Galois field multiplying operation;

wherein the twelfth Galois field multiplier performs a Galois field multiplying operation of the first syndrome $S_0$ and an output signal of the fifth XOR arithmetic element to output a result of the Galois field multiplying operation;

wherein the third XOR arithmetic element performs an XOR operation of an output signal of the fourth XOR arithmetic element and an output signal of the sixth Galois field multiplier to output an error location polynomial coefficient $\delta_2(3)$ under the first condition among the error location polynomial coefficients;

wherein the fourth XOR arithmetic element performs an XOR operation of an output signal of the seventh Galois field multiplier and an output signal of the eighth Galois field multiplier to output a result of the XOR operation;

wherein the fifth XOR arithmetic element performs an XOR operation of an output signal "$S_4 + S_0 \cdot S_3$" of the second common calculation block and an output signal of the eleventh Galois field multiplier to output an error location polynomial coefficient $\delta_2(3)$ under the third condition among the error location polynomial coefficients; and wherein the sixth XOR arithmetic element performs an XOR operation of an output signal of the sixth Galois field multiplier and an output signal of the twelfth Galois field multiplier to output an error location polynomial coefficient $\delta_3(3)$ under the third condition among the error location polynomial coefficients.

10. The error correction circuit of claim 9,
wherein the first condition corresponds to a case in which both of error location polynomial coefficients $\delta_0(0)$ and $\delta_0(1)$ are not "0" and both of control signals k(0) and k(1) are equal to or greater than "0";

wherein the second condition satisfies a first case in which the error location polynomial coefficient $\delta_0(0)$ is not "0" and the control signal k(0) is equal to or greater than "0" and a second case in which the error location polynomial coefficient $\delta_0(1)$ is "0" or the control signal k(1) is less than "0";

wherein the third condition satisfies a first case in which the error location polynomial coefficient $\delta_0(0)$ is "0" or the control signal k(0) is less than "0" and a second case in which the error location polynomial coefficient $\delta_0(1)$ is not "0" and the control signal k(1) is equal to or greater than "0"; and wherein the fourth condition satisfies a first case in which the error location polynomial coefficient $\delta_0(0)$ is "0" or the control signal k(0) is less than "0" and a second case in which the error location polynomial coefficient $\delta_0(1)$ is "0" or the control signal k(1) is less than "0".

11. The error correction circuit of claim 10,
wherein the error location polynomial coefficient $\delta_0(3)$ under the second condition and the error location polynomial coefficient $\delta_2(3)$ under the fourth condition are "0";

wherein the error location polynomial coefficient $\delta_0(3)$ under the fourth condition is "1"; and wherein the error location polynomial coefficient $\delta_1(3)$ under the fourth condition is the first syndrome $S_0$.

12. The error correction circuit of claim 1, wherein the error location calculator performs XOR operations and Galois field multiplying operations to the error location polynomial coefficients to calculate the error locations.

13. The error correction circuit of claim 1, wherein the error corrector receives the error locations and the "n"-bit codeword in parallel and corrects the errors of the codeword based on the error locations to output "n"-bit decoded output data in parallel.

14. An error correction circuit comprising: a syndrome calculator suitable for generating "2t"-number of parallel syndromes from an "n"-bit parallel codeword; an error location polynomial calculator suitable for generating error location polynomial coefficients based on the parallel syndromes; an error location calculator suitable for generating error locations based on the error location polynomial coefficients; and an error corrector suitable for generating decoded data of the codeword by correcting errors of the codeword based on the error locations, wherein the error correction circuit receives data from a memory device, and wherein the error correction circuit outputs error corrected data from the memory device to a host.

15. The error correction circuit of claim 14,
wherein the syndrome calculator generates the syndromes during a single unit of time;
wherein the error location polynomial calculator generates the error location polynomial coefficients during the single unit of time;
wherein the error location calculator generates the error locations during the single unit of time; and
wherein the error corrector generates the decoded data during the single unit of time.

16. The error correction circuit of claim 15, wherein the error correction circuit operates in a pipelining manner.

17. The error correction circuit of claim 14,
wherein the syndrome calculator includes "2t"-number of syndrome calculation blocks; and
wherein each of the "2t"-number of syndrome calculation blocks includes "(n−1)"-number of Galois field multipliers and an XOR arithmetic element.

18. The error correction circuit of claim 17,
wherein each of the "(n−1)"-number of Galois field multipliers performs a Galois field multiplying operation to one of the "n"-bit codeword other than a first bit and one of primitive elements of a Galois field to output resultant signals to the XOR arithmetic element; and
wherein the XOR arithmetic element performs an XOR operation to the resultant signals of the "(n−1)"-number of Galois field multipliers and the first bit of the "n"-bit codeword to output one of the syndromes.

19. The error correction circuit of claim 14, wherein the error location polynomial calculator generates the error location polynomial coefficients through Galois field multiplying operations and XOR operations to the syndromes.

20. The error correction circuit of claim 19,
wherein the error location polynomial coefficients includes "(t+1)"-number of error location polynomial coefficients; and
wherein the error location polynomial calculator performs pre-calculated Galois field multiplying operations and XOR operations according to a simplified inversionless Berlekamp-Massey (SiBM) algorithm to generate the "(t+1)"-number of error location polynomial coefficients under each of a plurality of conditions.

21. The error correction circuit of claim 20,
wherein the plurality of conditions are set to include "$2^{(t-1)}$"-number of conditions; and
wherein the total number of the error location polynomial coefficients generated by the error location polynomial calculator is "$2^{(t-1)} \times (t+1)$".

22. The error correction circuit of claim 21,
wherein the error location polynomial calculator includes at least one common calculation block, a plurality of Galois field multipliers, and a plurality of XOR arithmetic elements;
wherein the syndromes include "(2t−1)"-number of syndromes;
wherein the common calculation block performs partial Galois field multiplying operations to the "(2t−1)"-number of syndromes, the partial Galois field multiplying operations being required in common for calculation of the "$2^{(t-1)} \times (t+1)$"-number of error location polynomial coefficients;
wherein the plurality of Galois field multipliers perform Galois field multiplying operations to an output signal of the at least one common calculation block, the syndromes, and/or output signals of the plurality of XOR arithmetic elements to output at least one of the "$2^{(t-1)} \times (t+1)$"-number of error location polynomial coefficients; and
wherein the plurality of XOR arithmetic elements perform XOR operations to an output signal of the at least one common calculation block, the syndromes, and/or output signals of the plurality of Galois field multipliers to output at least one of the "$2^{(t-1)} \times (t+1)$"-number of error location polynomial coefficients.

23. The error correction circuit of claim 14, wherein the error location calculator performs XOR operations and Galois field multiplying operations to the error location polynomial coefficients to calculate the error locations.

* * * * *